(12) United States Patent
Srinivasan et al.

(10) Patent No.: US 6,727,190 B2
(45) Date of Patent: Apr. 27, 2004

(54) METHOD OF FORMING FLUORINE DOPED BORON-PHOSPHOROUS SILICATE GLASS (F-BPSG) INSULATING MATERIALS

(75) Inventors: Anand Srinivasan, Boise, ID (US); Gurtej Sandhu, Boise, ID (US); Ravi Iyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/146,839

(22) Filed: Sep. 3, 1998

(65) Prior Publication Data

US 2001/0021591 A1 Sep. 13, 2001

(51) Int. Cl.⁷ .............................................. H01L 21/316
(52) U.S. Cl. ....................... 438/789; 438/783; 438/790
(58) Field of Search ................................ 438/778, 783, 438/787–790

(56) References Cited

U.S. PATENT DOCUMENTS

| | | | |
|---|---|---|---|
| 5,104,482 A | * 4/1992 | Monkowski et al. | 427/255 |
| 5,288,518 A | * 2/1994 | Homma | 427/255 |
| 5,462,899 A | * 10/1995 | Ikeda | 438/790 |
| 5,521,424 A | * 5/1996 | Ueno et al. | 257/632 |
| 5,610,105 A | * 3/1997 | Vines et al. | 438/789 |
| 5,633,211 A | * 5/1997 | Imai et al. | 438/760 |
| 5,648,175 A | * 7/1997 | Russell et al. | 428/472.3 |
| 5,703,404 A | 12/1997 | Matsuura | 257/758 |
| 5,800,877 A | * 9/1998 | Maeda et al. | 427/255 |
| 5,849,644 A | * 12/1998 | Schuegraf | 438/790 |
| 5,876,798 A | * 3/1999 | Vassiliev | 427/255.3 |
| 5,908,672 A | * 6/1999 | Ryu et al. | 427/574 |
| 5,976,973 A | * 11/1999 | Ohira et al. | 438/645 |
| 6,009,827 A | * 1/2000 | Robles et al. | 118/723 R |
| 6,057,250 A | * 5/2000 | Kirchhoff et al. | 438/790 |
| 6,121,163 A | * 9/2000 | Gupta et al. | 438/788 |
| 6,121,164 A | * 9/2000 | Yieh et al. | 438/790 |
| 6,159,870 A | * 12/2000 | Chakravarti et al. | 438/784 |
| 6,191,026 B1 | * 2/2001 | Rana et al. | 438/624 |

FOREIGN PATENT DOCUMENTS

| | | | | |
|---|---|---|---|---|
| EP | 860869 A1 | * 8/1998 | ......... | H01L/21/316 |
| JP | 09-064029 | * 3/1997 | ......... | H01L/21/316 |
| JP | 10-242142 | * 9/1998 | ......... | H01L/21/316 |
| TW | 275699 | * 5/1996 | ......... | H01L/21/205 |

OTHER PUBLICATIONS

S. Wolf et al., Silicon Processing for the VLSI Era. vol. 1, 1986, Lattice Press, pp. 162–163 and 173.*
ARTICLE: Patrick, W., et al., "Properties of PECVD $O_2$/TEOS Silicon Dioxide", *Proceedings VLSI Science& Tech.* 1991, pp. 692–711.

* cited by examiner

*Primary Examiner*—Wael Fahmy
*Assistant Examiner*—Anh Duy Mai
(74) *Attorney, Agent, or Firm*—Wells St. John P.S.

(57) ABSTRACT

In one aspect, the invention includes a method of forming an insulating material comprising: a) providing a substrate within a reaction chamber; b) providing reactants comprising a Si, F and ozone within the reaction chamber; and c) depositing an insulating material comprising fluorine, silicon and oxygen onto the substrate from the reactants. In another aspect, the invention includes a method of forming a boron-doped silicon oxide having Si—F bonds, comprising: a) providing a substrate within a reaction chamber; b) providing reactants comprising Triethoxy fluorosilane, a boron-containing precursor, and ozone within the reaction chamber; and c) depositing a boron-doped silicon oxide having Si—F bonds onto the substrate from the reactants. In yet another aspect, the invention includes a method of forming a phosphorus-doped silicon oxide having Si—F bonds, comprising: a) providing a substrate within a reaction chamber; b) providing reactants comprising triethoxy fluorosilane, a phosphorus-containing precursor, and ozone within the reaction chamber; and c) depositing a phosphorus-doped silicon oxide having Si—F bonds onto the substrate from the reactants.

8 Claims, No Drawings

METHOD OF FORMING FLUORINE DOPED BORON-PHOSPHOROUS SILICATE GLASS (F-BPSG) INSULATING MATERIALS

TECHNICAL FIELD

The invention pertains to methods of forming insulating materials, such as, for example, materials comprising silicon oxide. In exemplary applications, the invention pertains to methods of forming boron and/or phosphorous doped materials comprising fluorine, silicon and oxygen.

BACKGROUND OF THE INVENTION

Silicon oxide materials (such as, for example, silicon dioxide) are commonly used in semiconductor device fabrication as insulating materials. Silicon oxide materials can be formed by chemical vapor deposition (CVD) from appropriate precursors. An exemplary combination of precursors that can be utilized for forming silicon oxide materials is silane ($SiH_4$) and hydrogen peroxide ($H_2O_2$). Another precursor combination which can be utilized for forming silicon oxides is tetraethyl orthosilicate (TEOS) and ozone ($O_3$).

Silicon oxide materials can be doped with one or both of boron and phosphorous to alter (lower) a dielectric constant of the material. The boron and/or phosphorous can be introduced into a silicon oxide material by, for example providing one or both of a boron-containing precursor material and a phosphorous precursor material in a CVD reaction chamber during deposition of the silicon oxide material. Suitable phosphorous precursor materials include, for example, $PH_3$ and tetraethoxy phosphine (TEPO). Suitable boron-containing precursors include, for example, $B_2H_6$ and triethyl borane (TEB). An alternative method of introducing phosphorus and/or boron into a silicon oxide material is to implant one or both of phosphorus and boron into the material.

A characteristic of a deposited silicon oxide material is its so-called flow temperature. A flow temperature is a temperature at which the silicon oxide material will melt. Flow temperature can be an important characteristic of silicon oxide materials. For instance, incorporation of silicon oxide materials into semiconductor fabrication processes frequently involves melting and reflowing of the materials to increase planarity and obtain good coverage of the materials over underlying device structures. Films consisting essentially of silicon dioxide typically have flow temperatures of about 1,100° C. or higher. Addition of boron or phosphorous to such films can reduce the flow temperatures to less than 850° C. It would be desirable to further reduce flow temperatures. Specifically, silicon oxide flow frequently occurs after provision of semiconductor devices in a semiconductor fabrication process. The high temperatures of silicon dioxide reflow can adversely affect such devices.

Another characteristic of silicon oxide materials is density. Denser materials generally have better flow properties than less dense materials. Specifically, denser materials can frequently reflow over underlying nonplanar structures more quickly than can less dense silicon oxide materials. Accordingly, it would be desirable to develop methods for densifying silicon oxide materials.

SUMMARY OF THE INVENTION

In one aspect, the invention encompasses a method of forming an insulating material. A substrate is provided within a reaction chamber together with reactants comprising Si, F and ozone. An insulating material comprising fluorine, silicon and oxygen is deposited onto the substrate from the reactants.

In another aspect, the invention encompasses a method of forming a boron-doped silicon oxide having Si—F bonds. A substrate is provided within a reaction chamber together with reactants comprising F-TES, a boron-containing precursor, and ozone. A boron-doped silicon oxide having Si—F bonds is deposited onto the substrate from the reactants.

In yet another aspect, the invention encompasses a method of forming a phosphorus-doped silicon oxide having Si—F bonds. A substrate is provided within a reaction chamber together with reactants comprising F-TES, a phosphorus-containing precursor, and ozone. A phosphorus-doped silicon oxide having Si—F bonds is deposited onto the substrate from the reactants.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention encompasses methods of chemical vapor deposition of insulating materials comprising fluorine, silicon and oxygen. In one aspect, the invention encompasses a method wherein a substrate is provided within a CVD reaction chamber together with reactants comprising Si, F and ozone. Subsequently, an insulating material comprising fluorine, silicon and oxygen is deposited onto the substrate from the reactants.

In an exemplary embodiment of the invention, the Si and F are comprised by a compound having an Si—F bond, such as, for example F-TES (triethoxy fluorosilane). The F-TES is preferably flowed into the reaction chamber at a rate from about 100 milligrams per minute (mg/min) to about 500 mg/min. The ozone is preferably flowed into the reaction chamber as a mixture with $O_2$ (the mixture preferably containing from about 5% to about 15% ozone, by volume), with an example being at a rate from about 1000 standard cubic centimeters per minute (sccm) to about 5000 sccm, and preferably about 2000 sccm. In addition to the F-TES and ozone, a second silicon precursor can be flowed into the reaction chamber. Such second silicon precursor can comprise, for example, TEOS. In alternative embodiments of the invention, the Si reactants can comprise TEOS and the F reactants can be comprised by molecules lacking Si.

Temperature of the substrate within the reaction chamber is preferably maintained at from about 400° C. to about 700° C., and more preferably maintained at about 500° C. Pressure within the reaction chamber is preferably maintained at from about 1 Torr to about 1 atmosphere, more preferably at from about 400 Torr to about 1 atmosphere, and even more preferably at about 600 Torr. Most preferably, no plasma is present within the CVD reaction chamber to reduce costs and process complexity. However, it is noted that the invention encompasses embodiments wherein plasma is present within the reaction chamber during the deposition process.

Under the above-described exemplary conditions, a material comprising fluorine, silicon and oxygen is deposited onto the substrate at a rate from about 500 Å/minute to about 10,000 Å/minute, and is typically deposited at a rate of about 8,000 Å/minute. The deposited material comprises silicon oxide interspersed with Si—F bonds. The fluorine is generally present in such material to a concentration from about 0.1 atomic percent to about 10 atomic percent.

An advantage of incorporating fluorine into a silicon oxide material is that the fluorine can reduce the flow temperature of the material. For instance, it is found that fluorine incorporation into a silicon oxide material to an amount of from about 0.1 atomic percent to about 10 atomic percent can reduce a flow temperature of the material. Specifically, it is found that a flow temperature of the material can be reduced by from about 50° C. to about 100° C. relative to a silicon oxide material that is identical to the fluorine-containing material in all respects except for lacking the fluorine.

Another advantage of incorporating Si—F bonds into a silicon oxide material (such as, for example, $SiO_2$ or borophosphosilicate glass) is that the fluorine can decrease a dielectric constant of the material.

Yet another advantage of incorporating fluorine into a silicon oxide material can be to reduce so-called fixed charge problems. Fixed charges result when one or more silicon atoms are bonded to less than four other atoms. In such circumstances, the silicon atoms can carry positively-charged electron density and shift a threshold voltage of a device incorporating the silicon atoms. Negatively charged fluorine atoms can interact with the positively-charged electron density to neutralize the density and alleviate fixed charge problems that would otherwise occur.

It is noted that F-TES has been utilized in the prior art in CVD processes for depositing silicon oxide materials. However, the F-TES was not utilized in combination with ozone. An aspect of the present invention is recognition that chemical vapor deposition of fluorine-containing silicon oxide from reactants comprising F-TES can be significantly improved if such reactants further comprise ozone. Specifically, it is recognized that if the reactants comprise F-TES and lack ozone, very little fluorine is incorporated into a deposited silicon oxide. The advantageous effects of ozone have not been seen with other oxygen-containing precursors. Specifically, it is found that $O_2$ and/or $H_2O_2$ work significantly less well than ozone as co-reactants with F-TES. In other words, if a comparable concentration of $H_2O_2$ or $O_2$ is utilized under the above-described reaction conditions in substitution of ozone, the silicon oxide that is formed will have significantly less than 0.1 atomic percent fluorine incorporated therein. Such silicon dioxide will have higher flow temperatures and less density than a preferred silicon oxide formed according to a method of the present invention utilizing ozone in a chemical vapor deposition process. Also, $H_2O_2$ can be more difficult to work with than ozone. For instance, it can be more difficult to accurately control an $H_2O_2$ concentration in a reaction chamber than to control an ozone concentration in the chamber.

In other aspects of the invention, a fluorine-containing silicon oxide can be provided to be doped with, for example, one or both of phosphorous and boron. For instance, a phosphorous precursor can be incorporated as a reactant in a chemical vapor deposition process of the present invention to form an insulating material comprising fluorine, silicon, oxygen, and phosphorous. The phosphorous precursor can comprise, for example, TEPO. Preferably, the amount of phosphorous incorporated into a fluorine-containing silicon oxide of the present invention is from about 1 atomic percent to about 10 atomic percent.

Exemplary conditions for incorporating phosphorous into a fluorine-containing silicon oxide utilizing a CVD process include:
 a pressure within a CVD reaction chamber of from about 1 Torr to about 1 atmosphere;
 a temperature of a substrate within the chamber of from about 400° C. to about 700° C.;
 a flow rate of F-TES into the reaction chamber of from about 100 mg/min to about 500 mg/min;
 a flow rate of ozone-containing gas (provided as a mixture of from about 5% to about 15% ozone in $O_2$) of from about 1000 sccm to about 5000 sccm; and
 a flow rate of TEPO in the reaction chamber of from about 25 mg/min to about 400 mg/min.

As another example, boron can be incorporated into a fluorine-containing silicon oxide of the present invention by providing a boron-containing precursor as a reactant in a CVD reaction chamber. The boron-containing precursor can comprise, for example, TEB. The boron is preferably provided in a fluorine-containing silicon oxide of the present invention to a concentration of from about 1 atomic percent to about 10 atomic percent, and more preferably provided to a concentration of less than or equal to about 8 atomic percent.

An exemplary process for incorporating boron into a fluorine-containing silicon oxide utilizing a CVD process includes:
 a pressure within a CVD reaction chamber of from about 1 Torr to about 1 atmosphere;
 a temperature of a substrate within the chamber of from about 400° C. to about 700° C.;
 a flow rate of F-TES into the reaction chamber of from about 100 mg/min to about 500 mg/min;
 a flow rate of ozone-containing gas (provided as a mixture of from about 5% to about 15% ozone in $O_2$) of from about 1000 sccm to about 5000 sccm; and
 a flow rate of TEB into the reaction chamber of from about 25 mg/min to about 400 mg/min.

In yet another exemplary application, a fluorine-containing silicon oxide of the present invention can be provided to be doped with both boron and phosphorous. Preferably, the boron and phosphorous atoms are together provided to a concentration of from about 3 atomic percent to about 12 atomic percent within the fluorine-containing silicon oxide. An exemplary composition of the silicon oxide comprises about 3% boron, about 7% phosphorous, and about 2% fluorine (by atomic percent).

Exemplary conditions for forming the boron and phosphorous doped fluorine-containing silicon oxide include:
 a pressure within a CVD reaction chamber of from about 1 Torr to about 1 atmosphere;
 a temperature of a substrate within the chamber of from about 400° C. to about 700° C.;
 a flow rate of F-TES into the reaction chamber of from about 100 mg/min to about 1000 mg/min;
 a flow rate of ozone-containing gas (provided as a mixture of from about 5% to about 15% ozone in $O_2$) of from about 1000 sccm to about 8000 sccm;
 a flow rate of TEPO in the reaction chamber of from about 25 mg/min to about 400 mg/min; and
 a flow rate of TEB into the reaction chamber of from about 25 mg/min to about 400 mg/min. In preferred embodiments, the pressure is from about 10 Torr to about 700 Torr.

In each of the above-described embodiments, the CVD reaction chamber referred to is a single wafer, cold wall chamber. The invention encompasses embodiment utilizing other types of reaction chambers.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a boron and phosphorus doped silicon oxide having Si—F bonds, comprising:
   providing a substrate within a CVD reaction chamber at a pressure of from about 1 Torr to about 760 Torr and at a substrate temperature of from about 400° C. to about 700° C.;
   flowing F-TES into the reaction chamber at a flow rate of from about 100 mg/min to about 1,000 mg/min;
   flowing an ozone-containing gas into the reaction chamber at a flow rate of from about 1,000 sccm to about 8,000 sccm, the gas containing a mixture of from about 5 vol % to about 15 vol % ozone in $O_2$;
   flowing TEPO into the reaction chamber at a flow rate of from about 25 mg/min to about 400 mg/min;
   flowing TEB into the reaction chamber at a flow rate of from about 25 mg/min to about 400 mg/min;
   providing the F-TES, ozone-containing gas, TEPO, and TEB simultaneously in the reaction chamber; and
   depositing a boron and phosphorous doped silicon oxide having Si—F bonds onto the substrate at a rate of from about 500 Å/min to about 10,000 Å/min with a plasma present in the reaction chamber, the doped silicon oxide comprising from about 3 atomic % to about 12 atomic % total of boron and phosphorous, comprising from about 0.1 atomic % to about 10 atomic % flourine, comprising more flourine than occurs in a doped silicon oxide deposited from an otherwise identical method using $O_2$ or $H_2O_2$ instead of $O_3$, exhibiting a flow temperature that is from about 50° C. to about 100° C. less than occurs in an otherwise identical doped silicon oxide lacking the fluorine, exhibiting a dielectric constant that is less than occurs in an otherwise identical doped silicon oxide lacking the fluorine, and exhibiting a fixed charge that is less than occurs in a doped silicon oxide deposited from an otherwise identical method using TEOS instead of F-TES.

2. The method of claim 1 wherein the CVD reaction chamber comprises a single wafer, cold wall chamber.

3. The method of claim 1 wherein the pressure comprises from about 10 Torr to about 700 Torr.

4. The method of claim 1 wherein the pressure comprises from about 400 Torr to about 700 Torr.

5. The method of claim 1 wherein the doped silicon oxide comprises from about 2 atomic % to about 10 atomic % flourine.

6. The method of claim 1 wherein the doped silicon oxide comprises 2 atomic % fluorine.

7. The method of claim 1 wherein the depositing occurs at a rate of from about 8,000 Å/min to about 10,000 Å/min.

8. The method of claim 1 wherein the pressure is 600 Torr, the substrate temperature is 500° C., the ozone-containing gas flow is 2,000 sccm, the deposition rate is 8,000 Å/min, the boron composition is 3 atomic %, and the phosphorous composition is 7 atomic %.

* * * * *

UNITED STATES PATENT AND TRADEMARK OFFICE
CERTIFICATE OF CORRECTION

PATENT NO.      : 6,727,190 B2
DATED           : April 27, 2004
INVENTOR(S)     : Anand Srinivasan et al.

It is certified that error appears in the above-identified patent and that said Letters Patent is hereby corrected as shown below:

Column 6,
Line 29, replace "gas flow is 2,000 sccm, the deposition rate is" with -- gas flow rate is 2,000 sccm, the deposition rate is --.

Signed and Sealed this

Tenth Day of January, 2006

JON W. DUDAS
*Director of the United States Patent and Trademark Office*